SELECTABLE FREQUENCY REFERENCE
Filed Sept. 13, 1957
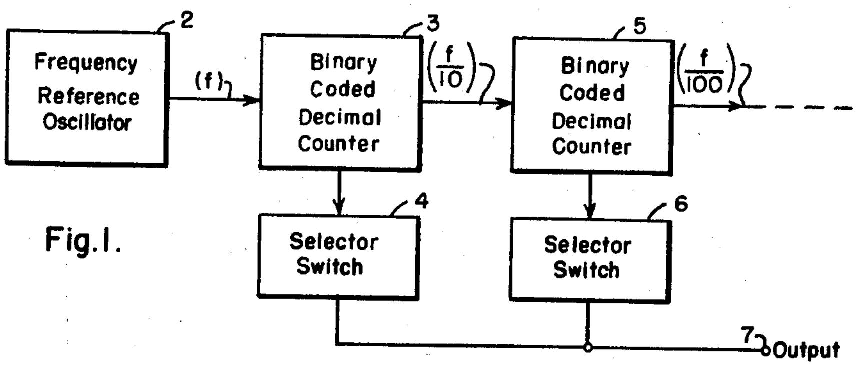
Fig. 1.
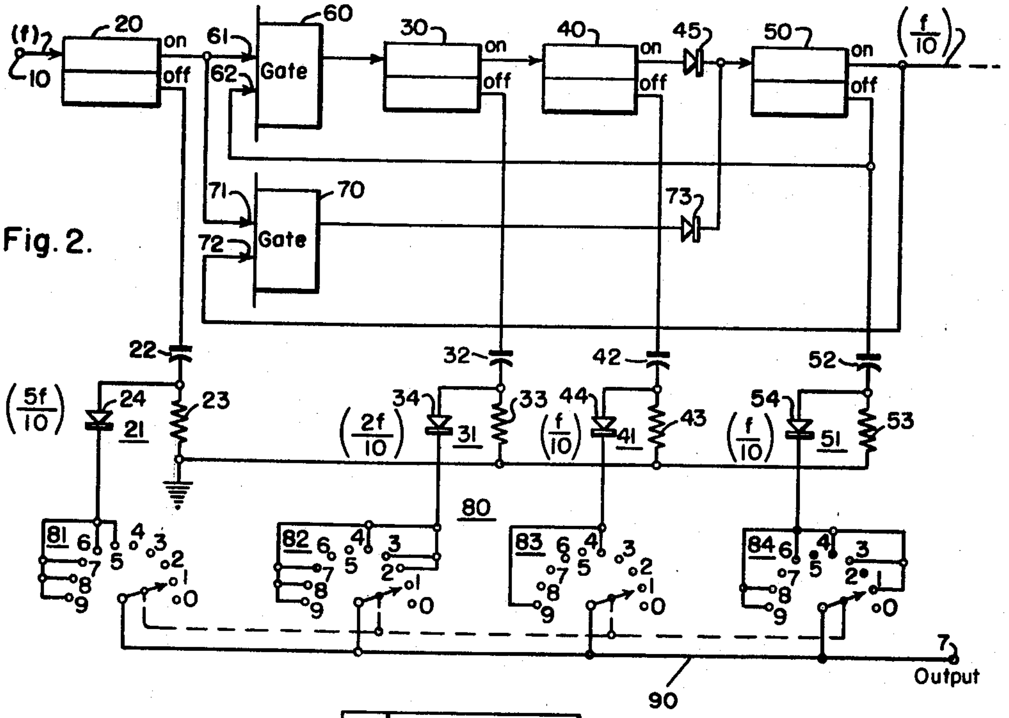
Fig. 2.
Fig. 3.
| | FLIP-FLOP | | | |
|---|---|---|---|---|
| | 20 | 30 | 40 | 50 |
| 0 | 0 | 0 | 0 | 0 |
| 1 | 1 | 0 | 0 | 0 |
| 2 | 0 | 1 | 0 | 0 |
| 3 | 1 | 1 | 0 | 0 |
| 4 | 0 | 0 | 1 | 0 |
| 5 | 1 | 0 | 1 | 0 |
| 6 | 0 | 1 | 1 | 0 |
| 7 | 1 | 1 | 1 | 0 |
| 8 | 0 | 0 | 0 | 1 |
| 9 | 1 | 0 | 0 | 1 |
WITNESSES:
Bernard R. Giegue
Myron E. Click
INVENTORS
Robert I. Van Nice &
Clarence J. Jones.
BY
F. E. Browder
ATTORNEY

United States Patent Office 2,937,337

Patented May 17, 1960

2,937,337

SELECTABLE FREQUENCY REFERENCE

Clarence I. Jones, Pitcairn, and Robert I. Van Nice, Glenshaw, Pa., assignors to Westinghouse Electric Corporation, East Pittsburgh, Pa., a corporation of Pennsylvania Application September 13, 1957, Serial No. 683,764

7 Claims. (Cl. 328—48)

This invention relates to frequency references in general and in particular to selectable frequency references having high accuracy and stability.

In the field of frequency and speed controls it is desirable to have a highly accurate frequency reference whose frequency can be varied over a wide range. Conventional variable frequency oscillators now in use are limited to a maximum calibration accuracy of one percent (1%) and maximum stability of one-tenth of one percent (.1%). Where better accuracies have been desired it was necessary to utilize a single frequency oscillator which may have a stability and calibration accuracy as high as one part in one million. If a range of frequencies is desired, a group of such single frequency oscillators is used giving high accuracy and several selected frequencies.

It is an object of this invention to provide an improved frequency reference.

It is another object of this invention to provide an improved frequency reference which will give the accuracy and stability of a single frequency oscillator but will remain as flexible in use as a variable frequency oscillator.

It is a further object of this invention to provide an improved frequency reference wherein a desired frequency may be selected on a simple decimal basis.

Further objects of this invention will become apparent when the following description is taken in conjunction with the accompanying drawings. In the drawings, for illustrative purposes only, is shown a preferred form of the invention.

Figure 1 is a block diagram of an improved frequency reference embodying the teachings of this invention;

Figure 2 is a diagram of a binary coded decimal counter utilized in Figure 1; and Figure 3 is a table showing the various states of a flip-flop utilized in Figure 2.

Referring to Figure 1, there is illustrated a selectable frequency reference embodying the teachings of this invention. The output of a single frequency reference oscillator 2 is connected to the input of a binary coded decimal counter 3. The output of the binary coded decimal counter 3 is connected to a selector switch 4 and to a second binary decimal counter 5. The binary coded decimal counter 5 has its output connected to a selector switch 6. The outputs of the selector switches 4 and 6 are connected to an output terminal or bus 7.

As is noted in Figure 1 the frequency *f* of the single frequency reference oscillator 2 is designed to be the maximum frequency desired and is used to drive a series of binary coded decimal counter stages 3, 5 . . . etc. As the original frequency *f* passes through each binary coded decimal counter, the output frequency to the next stage is divided by 10. Thus, the output from the binary coded decimal counter 3 is $\frac{1}{10}$ of the frequency of the single frequency oscillator 2. The output of the binary coded decimal counter 5 is $\frac{1}{100}$ of the output frequency of the single frequency reference oscillator 2.

The frequency reference 2 may be of the crystal or tuning fork type and should be constructed of reliable elements to insure maximum service. The binary coded decimal counters may be transistorized counters having all the components selected for reliability. The selector switches 4 and 6 are arranged so that the output frequency may be selected and read in a decimal fashion.

Referring to Figure 2, there is illustrated a diagram of a binary coded decimal counter as utilized in Figure 1. In general, the counter in Figure 2 comprises an input terminal means 10, flip-flop elements 20, 30, 40, and 50 first and second gating circuits 60 and 70, differentiating circuits 21, 31, 41 and 51, a selector switch 80 and an output terminal or bus means 90.

The input terminal 10 is connected to the input flip-flop 20. An On antecedent On terminal of the input flip-flop 80 is connected to a terminal 61 of the gate circuit 60 and to a terminal 71 of the gate circuit 70. An Off terminal of the flip-flop 20 is connected through the differentiating circuit 21, shown here as comprising a capacitor 22 and a resistor 23 connected in series, to ground. The output of the gate circuit 60 is connected to the input of the flip-flop 30. An On terminal of the flip-flop 30 is connected to the input of the flip-flop 40. An off terminal of the flip-flop 30 is connected through the differentiating circuit 31, comprising a capacitor 32 and a resistor 33 connected in series, to ground. An On terminal of the flip-flop 40 is connected through an isolating rectifier 45 to the input of the flip-flop 50. An Off terminal of the flip-flop 40 is connected through the differentiating circuit 41, comprising a capacitance 42 and a resistor 43 connected in series, to ground. An On terminal of the flip-flop 50 is connected to a terminal 72 of the gating circuit 70 and may be also connected to a succeeding binary coded decimal counter stage as shown in Figure 1. An Off terminal of the flip-flop 50 is connected through the differentiating circuit 51, comprising a capacitance 52 and a resistance 53 connected in series, to ground. The output of the gate circuit 70 is connected through an isolating rectifier 73 to the input of the flip-flop 50.

The junction of the capacitor 22 and the resistance 23 is connected through an isolating rectifier 24 to circuit 81 of the four-circuit, 10-position switch 80. The junction of the capacitance 32 and the resistance 33 is connected through an isolating rectifier 34 to circuit 82 of the switch 80. The junction of the capacitance 42 and the resistance 43 is connected through an isolating rectifier 44 to circuit 83 of the switch 80. The junction of the capacitance 52 and a resistance 53 is connected through an isolating rectifier 54 to circuit 84 of the switch 80. The switch 80 is connected to an output terminal or bus 90.

In the embodiment shown in Figure 2 the flip-flop elements 20, 30, 40 and 50 may be of any common type which will change state from "On" to "Off" or "Off" to "On" upon the receipt of a pulse at its input. The flip-flop elements then in the embodiments of Figure 2 will be so connected to cause an output pulse from the On terminal whenever the state of the flip-flop element changes from "one" to "zero." The "one" and "zero" outputs or states are indications of the state of the flip-flop elements and are two different voltage levels. One of these voltage levels may be, in fact, zero in reality but the circuit will be operative as long as the outputs of the flip-flop elements are two distinct direct current voltage levels. The flip-flop elements are also constructed so that when the flip-flop element changes state from "zero" to "one" an output pulse will occur from the Off terminal of each flip-flop element. This is accomplished by connecting the differentiating circuits 21, 31, 41 and 51 between the "Off" terminals of the flip-flop elements 20, 30, 40 and 50, respectively, and ground. The operation of the differentiating circuits 21, 31, 41 and 51 is well known to those skilled in the art and will not be explained in detail here. However, when a flip-flop element changes state from "zero" to "one," a differentiating circuit will produce an output pulse through its respective isolating rectifier to one of the circuits 81, 82, 83 and 84 of the four circuit, ten-position switch 80.

In the counter illustrated in Figure 2, the changing of the flip-flop elements from "one" to "zero" will be defined as an output "carry pulse." As hereinbefore described, these carry pulses will occur only at the "On" terminals of the respective flip-flop elements. When the flip-flop elements change state from "zero" to "one," the output pulses from the "Off" terminals of the respective flip-flop elements will be defined as "non-carry pulses." In Figure 3, which shows the state of the respective flip-flop after a given number of pulses have been received at terminal 10, the time of the occurence of the non-carry pulses is marked with a horizontal bar. It is noted from Figure 3 that these pulses are anti-coincident. This must be true of all non-carry pulses in the counter illustrated in Figure 3 since each non-carry pulse of any given flip-flop element is generated by coincident carry pulses from all the operative preceding flip-flop elements and all succeeding flip-flop elements are non-operative as no carry pulse is being transmitted down the chain from the given flip-flop element.

The operation of the binary coded decimal counter illustrated in Figure 2 is as follows. Incoming pulses from the single frequency reference oscillator 2 to the input terminal 10 cause the flip-flop element 20 to change state with each pulse. On the "one" to "zero" transition, or the second pulse received from the single frequency reference oscillator 2, the flip-flop element 20 transmits a carry pulse which serves as the input pulse to the terminal 61 of the gate 60. The gating circuits 60 and 70 are well known in the art and will not be described in detail here. The function of the gating circuits 60 and 70 is that an output will be obtained when, and only when, inputs are present at both of the terminals 61 and 62 of the gating circuit 60 and terminals 71 and 72 of the gating circuit 70. Assuming that the counter illustrated in Figure 2 is started from zero the flip-flop element 50 will be in an Off position. The output signal at the Off terminal of the flip-flop 50 is connected to the terminal 62 of the gating circuit 60. Therefore, as long as the flip-flop element 50 remains Off, the gating circuit 60 will pass pulses received from the On terminal of the flip-flop element 20.

The output of the gating circuit 60 from the second pulse of frequency reference 2 will turn the flip-flop element 30 On. The third pulse from the frequency reference 2 turns the flip-flop element 20 On once more. The fourth pulse from the frequency reference 2 turns the flip-flop element 20 Off, causing the flip-flop element 20 to transmit a carry pulse through the gating circuit 60 to the flip-flop element 30 which will turn the flip-flop element 30 Off. The transition of the flip-flop element 30 from "one" to "zero" causes a carry pulse to be transmitted to the flip-flop element 40, turning the flip-flop element 40 On. The fifth pulse from the frequency reference oscillator 2 will turn the flip-flop element 20 On and no carry pulse will be transmitted through the gate 60. The sixth pulse from the frequency reference 2 will turn the flip-flop element 20 Off and the transition from "one" to "zero" will transmit a carry pulse to the flip-flop element 30 turning the flip-flop element 30 On. The seventh pulse from the frequency reference 2 will turn the flip-flop element 20 On with no carry pulse transmitted to the succeeding flip-flop elements. On the eighth pulse from the frequency reference 2 the flip-flop elements 20, 30, and 40 will change states as hereinbefore described and the flip-flop element 40 will transmit a carry pulse through the isolating rectifier 45 to the flip-flop element 50 turning the flip-flop element 50 On. When the flip-flop element 50 is turned On the gate 60 loses the signal at the terminal 62. The gate 70, however, gains a signal from the On terminal of the flip-flop element 50 at its terminal 72. On the ninth pulse from the frequency reference 2 the flip-flop element 20 will change states from Off to On with no carry pulse being transmitted from its On terminal. On the tenth pulse from the frequency reference 2 the flip-flop element 20 will again change state from On to Off transmitting a carry pulse through the gate 70 and the isolating rectifier 73 to the flip-flop element 50 changing the flip-flop element 50 from On to Off. Thus, the tenth pulse from the frequency reference 2 resets the flip-flop elements 20 and 50 and the entire unit is returned to its initial state. This resetting action also releases the carry pulse from the On terminal of the flip-flop element 50 that may be used to drive the next binary coded decimal counter stage.

An examination of the sequence of the change of states of the flip-flop elements, 20, 30, 40 and 50 during a complete counter cycle will show that the flip-flop element 20 has changed states ten times, the flip-flop element 30 has changed states four times, the flip-flop element 40 has changed states two times and the flip-flop element 50 has changed states two times. Therefore, there has been a "zero" to "one" transition in the flip-flop element 20 five times and five non-carry pulses have been transmitted from the differentiating circuit 21 through the isolating rectifier 24 to the circuit 81 of the switch 80. There has been a "zero" to "one" transition two times in the flip-flop element 30 causing the transmission of two non-carry pulses from the differentiating circuit 31 through the isolating rectifier 34 to the circuit 82 of the switch 80. There has been a "zero" to "one" transition one time in the flip-flop element 40 causing the transmission of one non-carry pulse from the differentiating circuit 41 through the isolating rectifier 44 to the circuit 83 of the switch 80. There has been a "zero" to "one" transition one time in the flip-flop element 50 causing the transmission of one non-carry pulse from the differentiating circuit 51 through the isolating rectifier 54 to the circuit 84 of the switch 80. Each of the flip-flop elements 20, 30, 40 and 50 therefore, represent one binary digit.

The differentiating circuit 21 is connected to switching positions 5, 6, 7, 8 and 9 of the circuit 81 of the switch 80. The differentiating circuit 31 is connected to positions 2, 3, 4, 7, 8 and 9 of the circuit 82 of the switch 80. The differentiating circuit 41 is connected to the positions 4 and 9 of the circuit 83 of the switch 80. The differentiating circuit 51 is connected to positions 1, 3, 4, 6, 8 and 9 of the circuit 84 of the switch 80. Thus, it can be seen that as the ganged contacts of the circuits 81, 82, 83 and 84 are turned from the positions 1 to 9 that the position numbers will indicate the number of pulses per 10 pulses of the frequency reference 2 that will be mixed at the output terminal or bus 90.

It is to be noted that any desired number of output buses can be supplied with arbitrarily selected frequencies by adding a set of switches for each bus. Additional stages of binary coded decimal counters and selector switches will permit the frequency of the frequency reference oscillator 2 to be divided decimally as desired. The selection of frequency is made simply by setting the decimal number on a set of dials or push buttons. The accuracy of the selectable frequency reference may be made as high as the accuracy of the frequency reference oscillator 2.

In conclusion, it is pointed out that while the illustrated examples constitute practical embodiments of our invention, we do not limit ourselves to the exact details shown since modification of the same may be varied without departing from the spirit of this invention.

We claim as our invention:

1. In a frequency reference, in combination, oscillator means providing a reference frequency, binary counter means and selector switching means, said oscillator means being connected to the input of said binary counter means, said binary counter means being operative to count a predetermined number of pulses from said oscillator means before resetting, said binary counter means comprising a plurality of flip-flop elements, each of said flip-flop elements having two stable states and representing one binary digit, said selector switching means having a plurality of circuits so connected to said binary counter means so that a predetermined setting of said selector switching means will mix any number of output pulses of said plurality of flip-flop elements on a common output means up to said predetermined number of pulses supplied by said oscillator means.

2. In a frequency references, in combination, oscillator means providing a reference frequency, binary counter means and selector switching means, said oscillator means being connected to the input of said binary counter means, said binary counter means being operative to count a predetermined number of pulses from said oscillator means before resetting, said binary counter means comprising a plurality of flip-flop elements, each of said flip-flop elements having two stable states, each said stable state representing a binary digit, said selector switching means having a plurality of circuits so connected to said binary counter means so that a predetermined setting of said selector switching means will mix any number of output pulses of said plurality of flip-flop elements on a common output means up to said predetermined number of pulses supplied by said oscillator means.

3. In a frequency reference, in combination, oscillator means providing a reference frequency, resettable binary counter means and selector switching means, said oscillator means being connected to the input of said binary counter means, said binary counter means being operative to count a predetermined number of impulses from said oscillator means before resetting, said binary counter means comprising a plurality of flip-flop elements, each of said flip-flop elements having two stable states, each said stable state representing a binary digit, said selector switching means having a plurality of circuits connected to said binary counter means so that decimal settings of said selector switching means will mix a corresponding decimal number of output pulses of said plurality of flip-flop elements of said counter means in a common output means.

4. In a frequency reference, in combination, oscillator means providing a reference frequency, resettable binary counter means and selector switching means, said oscillator means being connected to the input of said binary counter means, said binary counter means being operative to count a predetermined number of pulses from said oscillator means before resetting, said binary counter means comprising a plurality of flip-flop elements, each of said flip-flop elements having two stable states, each of said stable states representing one binary digit, said selector switching means having a plurality of circuits, each of said plurality of circuits connected to an associated flip-flop element of said binary counter means through differentiating circuits, decimal setting means for said selector switching means connecting a corresponding decimal number of output pulses of said differentiating circuits to said plurality of circuits of said selector switching means in a common output means.

5. In a frequency reference, in combination, oscillator means providing a reference frequency, resettable counter means and selector switching means; said counter means comprising input flip-flop element means for receiving pulses from said oscillator means; said input flip-flop element means being connected to a plurality of succeeding flip-flop element means through a first gate circuit; said first gate circuit being gated by a signal from an Off terminal of the last of said succeeding flip-flop element means; said counter means being operative to count a predetermined number of pulses in binary fashion from said oscillator means before resetting; said counter means being operative to produce a cycle of output pulses to said selector switching means; said selector switching means being operative to allow decimal selection of a desired number of pulses per counter cycle.

6. In a frequency reference, in combination, oscillator means providing a reference frequency, resettable counter means and selector switching means; said counter means comprising input flip-flop element means for receiving pulses from said oscillator means; said flip-flop elements having "On" terminals and "Off" terminals; said input flip-flop element means being connected to a plurality of succeeding flip-flop element means through a first gate circuit; said first gate circuit being gated by a signal from an Off terminal of the last of said succeeding flip-flop element means; said input flip-flop element means also being connected to said last flip-flop element means through a second gate circuit; said counter means being operative to count a predetermined number of pulses in binary fashion from said oscillator means before resetting; said counter means being operative to produce a cycle of output pulses to said selector switching means; said selector switching means being operative to allow decimal selection of a desired number of pulses per counter cycle.

7. In a frequency reference, in combination, oscillator means providing a reference frequency, resettable counter means and selector switching means; said counter means comprising input flip-flop element means for receiving pulses from said oscillator means; said input flip-flop element means having "On" and "Off" terminals; said input flip-flop element means being connected to a plurality of succeeding flip-flop element means through a first gate circuit; said first gate circuit being gated by a signal from an Off terminal of the last of said succeeding flip-flop element means; said input flip-flop element means being connected to said last flip-flop element means through a second gate circuit; said second gate circuit being gated by a signal from an On terminal of said last flip-flop element means; said counter means being operative to count a predetermined number of pulses in binary fashion from said oscillator means before resetting; said counter means being operative to produce a cycle of output pulses to said selector switching means; said selector switching means being operative to allow decimal selection of a desired number of pulses per counter cycle.

References Cited in the file of this patent

UNITED STATES PATENTS

| | | |
|---|---|---|
| 2,519,184 | Grosdoff | Aug. 15, 1950 |
| 2,563,841 | Jensen | Aug. 14, 1951 |
| 2,574,145 | Freas | Nov. 6, 1951 |
| 2,693,593 | Crosman | Nov. 2, 1954 |

FOREIGN PATENTS

| | | |
|---|---|---|
| 596,670 | Great Britain | Jan. 8, 1948 |

OTHER REFERENCES

Electronics, February 1953, pp. 145–147, "Gated Decade Counter Requires No Feedback," by E. L. Kemp.